(12) United States Patent
Li et al.

(10) Patent No.: US 12,232,252 B2
(45) Date of Patent: Feb. 18, 2025

(54) BACKPLANE, BACKLIGHT SOURCE, ILLUMINATION DEVICE AND DISPLAYING DEVICE

(71) Applicants: Hefei Xinsheng Optoelectronics Technology Co., Ltd., Anhui (CN); BOE Technology Group Co., Ltd., Beijing (CN)

(72) Inventors: Yongfei Li, Beijing (CN); Liuyue Yin, Beijing (CN); Haifeng Hu, Beijing (CN); Huan Liu, Beijing (CN); Mengmeng Li, Beijing (CN); Yuancheng Li, Beijing (CN); Yu Jiang, Beijing (CN); Qin Zeng, Beijing (CN); Zouming Xu, Beijing (CN); Jian Tian, Beijing (CN); Chunjian Liu, Beijing (CN); Xintao Wu, Beijing (CN); Jie Lei, Beijing (CN); Jie Wang, Beijing (CN); Jianying Zhang, Beijing (CN)

(73) Assignees: Hefei Xinsheng Optoelectronics Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 538 days.

(21) Appl. No.: 17/508,932

(22) Filed: Oct. 22, 2021

(65) Prior Publication Data
US 2022/0264743 A1    Aug. 18, 2022

(30) Foreign Application Priority Data
Feb. 18, 2021    (CN) .......................... 202110190306.8

(51) Int. Cl.
*H01L 29/45*    (2006.01)
*H01L 33/62*    (2010.01)
(Continued)

(52) U.S. Cl.
CPC ........... *H05K 1/0298* (2013.01); *H01L 33/62* (2013.01); *G09G 2300/0426* (2013.01);
(Continued)

(58) Field of Classification Search
CPC ................. H05K 1/0298; H05K 1/181; H05K 2201/09672; H05K 2201/10106;
(Continued)

(56) References Cited

U.S. PATENT DOCUMENTS

| | | | | |
|---|---|---|---|---|
| 2015/0084043 A1* | 3/2015 | Ishihara | ............ | H01L 29/78648 257/43 |
| 2015/0214376 A1* | 7/2015 | Koezuka | ................ | G02F 1/1368 257/43 |

(Continued)

FOREIGN PATENT DOCUMENTS

| | | |
|---|---|---|
| CN | 103474471 A | 12/2013 |
| CN | 209401247 U | 9/2019 |

(Continued)

OTHER PUBLICATIONS

CN 202110190306.8 first office action.

*Primary Examiner* — Abdul-Samad A Adediran
(74) *Attorney, Agent, or Firm* — IPro, PLLC

(57) ABSTRACT

A backplane, a backlight source, an illumination device and a displaying device. The backplane comprises a substrate; a first metal trace layer disposed on one surface of the substrate; an insulating layer disposed on a side, away from the substrate, of the first metal trace layer; a second metal trace layer disposed on a side, away from the substrate, of the insulating layer, an overlapping area existing between an orthographic projection of the second metal trace layer on the substrate and an orthographic projection of the first metal trace layer on the substrate; and a barrier layer disposed between the first metal trace layer and the second metal trace (Continued)

layer, an orthographic projection of the barrier layer on the substrate covering the overlapping area, and the barrier layer being used for preventing metals in the first metal trace layer and the second metal trace layer from growing towards each other.

18 Claims, 7 Drawing Sheets

(51) Int. Cl.
 *H05K 1/02* (2006.01)
 *H01L 25/075* (2006.01)
 *H05K 1/18* (2006.01)

(52) U.S. Cl.
 CPC .......... *H01L 25/0753* (2013.01); *H05K 1/181* (2013.01); *H05K 2201/09672* (2013.01); *H05K 2201/10106* (2013.01)

(58) Field of Classification Search
 CPC ................ H01L 33/62; H01L 25/0753; H01L 29/78648; G09G 2300/0426; G02F 1/1368; G02B 3/00
 USPC ..................................................... 257/40, 43
 See application file for complete search history.

(56) References Cited

U.S. PATENT DOCUMENTS

| | | |
|---|---|---|
| 2015/0340455 A1 | 11/2015 | Cao et al. |
| 2019/0181161 A1 | 6/2019 | Li |
| 2022/0386449 A1 | 12/2022 | Gong |
| 2023/0217791 A1* | 7/2023 | Kajimoto ................ G02B 3/00 257/40 |

FOREIGN PATENT DOCUMENTS

| | | |
|---|---|---|
| CN | 110968219 A | 4/2020 |
| CN | 111491441 A | 8/2020 |
| TW | I221398 B | 9/2004 |

* cited by examiner

BACKPLANE, BACKLIGHT SOURCE, ILLUMINATION DEVICE AND DISPLAYING DEVICE

CROSS REFERENCE TO RELEVANT APPLICATIONS

The present application claims the priority of the Chinese patent application filed on Feb. 18, 2021 before the Chinese Patent Office with the application number of 202110190306.8 and the title of "BACKPLANE, BACKLIGHT SOURCE, ILLUMINATION DEVICE AND DISPLAYING DEVICE", which is incorporated herein in its entirety by reference.

TECHNICAL FIELD

The disclosure relates to the technical field of backplane, in particular to a backplane, a backlight source, an illumination device and a displaying device.

BACKGROUND

At present, for Mini/Micro-LED products, in order to meet the requirement for low channel resistance, a thick Cu process is usually adopted (i.e., copper traces with large thicknesses are adopted). However, Cu is an active metal, and copper ions tend to migrate and grow under the influence of foreign particles, voltage and other external environments.

SUMMARY

The disclosure aims at solving one of the technical problems in the related art at least to some extent. The purpose of the disclosure is to provide a backplane which may effectively solve the problem of short circuits between upper and lower metal trace layers and is easy to prepare, a backlight source, an illumination device and a displaying device.

In one aspect of the disclosure, a backplane is provided. According to the embodiment of the disclosure, the backplane comprises a substrate; a first metal trace layer disposed on one surface of the substrate; an insulating layer disposed on a side, away from the substrate, of the first metal trace layer; a second metal trace layer disposed on a side, away from the substrate, of the insulating layer, an overlapping area existing between an orthographic projection of the second metal trace layer on the substrate and an orthographic projection of the first metal trace layer on the substrate; and a barrier layer disposed between the first metal trace layer and the second metal trace layer, an orthographic projection of the barrier layer on the substrate covering the overlapping area, and the barrier layer being used for preventing metals in the first metal trace layer and the second metal trace layer from growing towards each other. In the backplane, the barrier layer may effectively prevent the two metal trace layers from migrating and growing towards each other, thus effectively reducing the risk of short-circuit between the two metal trace layers.

According to the embodiments of the disclosure, a voltage difference exists between the first metal trace layer and the second metal trace layer;

when a voltage of the first metal trace layer is greater than a voltage of the second metal trace layer, the barrier layer is disposed on a surface, close to the second metal trace layer, of the first metal trace layer; or when the voltage of the first metal trace layer is less than the voltage of the second metal trace layer, the barrier layer is disposed on a surface, close to the first metal trace layer, of the second metal trace layer.

According to the embodiments of the disclosure, the barrier layer is disposed on a surface, close to the second metal trace layer, of the first metal trace layer.

According to the embodiments of the disclosure, an orthographic projection of the barrier layer on the substrate completely superposes with the orthographic projection of the first metal trace layer on the substrate.

According to the embodiments of the disclosure, the first metal trace layer comprises a first FPC connecting wire, an orthographic projection of the first FPC connecting wire on the substrate and the orthographic projection of the second metal trace layer on the substrate are completely non-superposed.

According to the embodiments of the disclosure, the first metal trace layer comprises a circuit driving signal wire, the second metal trace layer comprises a first electrode connecting wire and a second electrode connecting wire, and the first electrode connecting wire is electrically connected with the circuit driving signal wire through a first via hole penetrating through the insulating layer.

According to the embodiments of the disclosure, the barrier layer is disposed on a surface, close to the first metal trace layer, of the second metal trace layer.

According to the embodiments of the disclosure, an orthographic projection of the barrier layer on the substrate completely superposes with the orthographic projection of the second metal trace layer on the substrate.

According to the embodiments of the disclosure, the first metal trace layer comprises a first FPC connecting wire, the second metal trace layer comprises a second FPC connecting wire, and the second FPC connecting wire is electrically connected with the first FPC connecting wire through a second via hole penetrating through the insulating layer.

According to the embodiments of the disclosure, the first metal trace layer and the second metal trace layer are each made of at least one of copper, aluminum and silver.

According to the embodiments of the disclosure, the barrier layer is made of a conductive material, the conductive material comprises a conductive oxide, and the conductive oxide comprises indium tin oxide.

According to the embodiments of the disclosure, the barrier layer is of a whole layer structure and is made of a non-conductive material.

In another aspect of the disclosure, a method for preparing a backplane is provided. According to the embodiment of the disclosure, the method comprises: sequentially forming a first metal trace layer on a substrate; forming an insulating layer on a side, away from the substrate, of the first metal trace layer; forming a second metal trace layer on a side, away from the substrate, of the insulating layer, an overlapping area existing between an orthographic projection of the second metal trace layer on the substrate and an orthographic projection of the first metal trace layer on the substrate; and forming a barrier layer between the first metal trace layer and the second metal trace layer, an orthographic projection of the barrier layer on the substrate covering the overlapping area, and the barrier layer being used for preventing metals in the first metal trace layer and the second metal trace layer from migrating and growing towards each other. The method is easy and convenient to implement and highly compatible with existing processes, the short-circuit risk of the obtained backplane is greatly reduced, and high yield, good stability and long service life are realized.

According to the embodiment of the disclosure, the barrier layer and the first metal trace layer or the second metal trace layer are formed by a mask.

In another aspect of the disclosure, a backlight source, an illumination device or a displaying device is provided. According to the embodiment of the disclosure, the backlight source, the illumination device or the displaying device comprises the aforementioned backplane. The short-circuit risk of metal traces in the backlight source, the illumination device or the displaying device is greatly reduced, safety and stability are significantly improved, and the service life is effectively prolonged.

According to the embodiment of the disclosure, the backlight source, the illumination device or the displaying device further comprises an LED chip electrically connected with a first electrode connecting wire and a second electrode connecting wire in a second metal trace layer of the backplane.

According to the embodiment of the disclosure, the LED chip is a Mini LED chip or a Micro LED chip.

BRIEF DESCRIPTION OF THE DRAWINGS

To describe the technical solutions of the present disclosure more clearly, the accompanying drawings required for describing some embodiments of the present disclosure may be briefly introduced below. Apparently, the accompanying drawings in the following description are merely accompanying drawings of some embodiments of the present disclosure. To those of ordinary skills in the art, other accompanying drawings may also be derived from these accompanying drawings without creative efforts. In addition, the accompanying drawings in the following description may be regarded as schematic diagrams, and are not a limitation on the actual size of the product and the actual process of the method involved in the embodiment of the present disclosure.

DETAILED DESCRIPTION

Embodiments of the disclosure are described in detail below. The embodiments described below are exemplary and are only used to explain the disclosure, and should not be construed as limiting the disclosure. If specific technologies or conditions are not indicated in the embodiments, they shall be performed according to the technologies or conditions described in the literature in this field or according to the product specifications.

Figure 1:
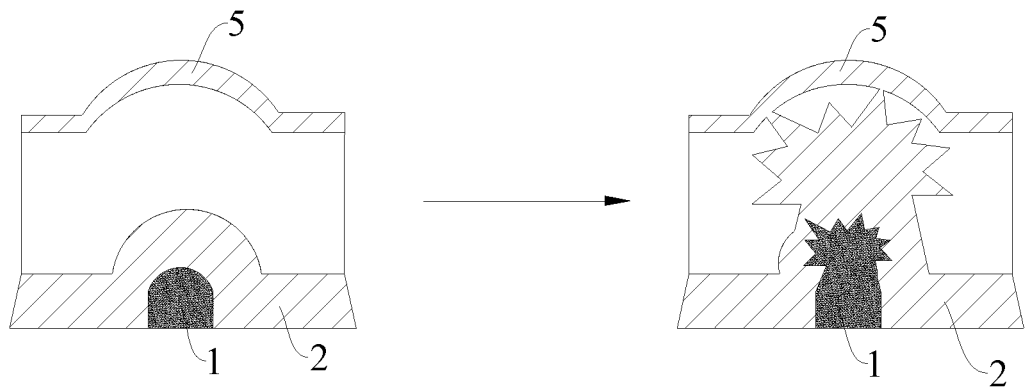
FIG. 1 is a diagram of the principle of a short circuit between two metal trace layers caused by the introduction of foreign particles during the preparation of a backplane.
Figure 2:
FIG. 2 is a cross-sectional structure diagram of a sample introduced with foreign particles during the preparation of a backplane.
Figure 3:
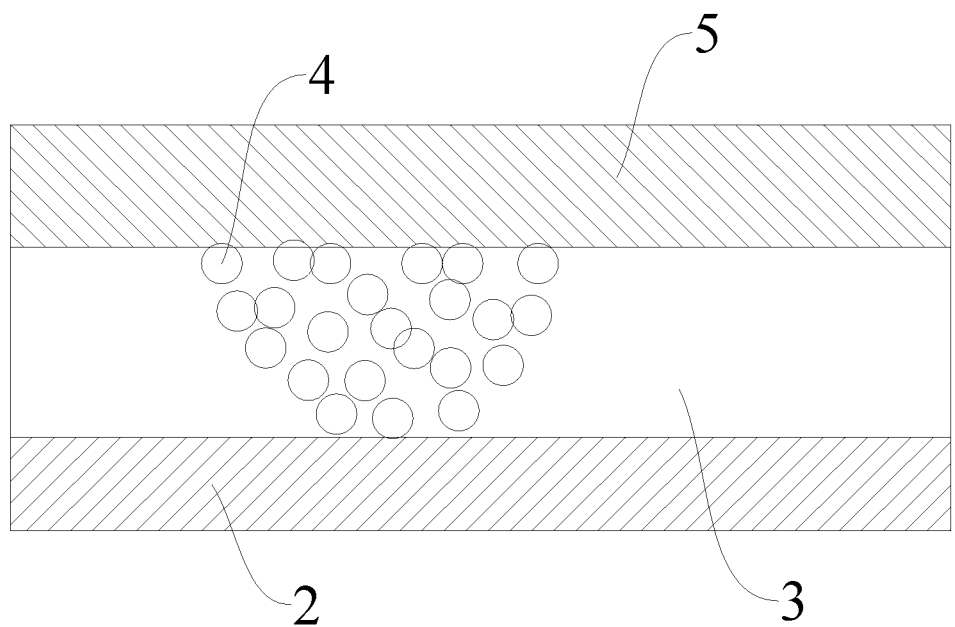
FIG. 3 is a diagram of the principle of metal migration and growth when a voltage difference exists between two metal trace layers in a backplane.
Figure 4:
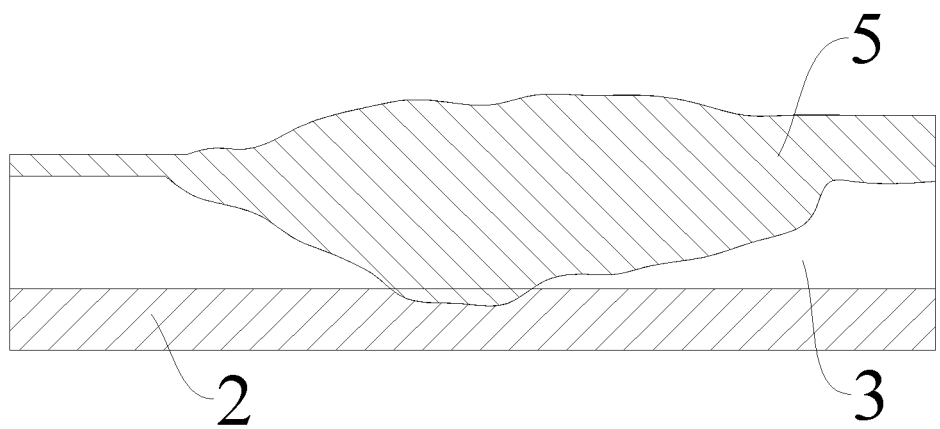
FIG. 4 is a cross-sectional structure diagram of a sample with a short circuit caused by metal migration and growth between two metal trace layers in a backplane.

The invention is based on the following findings and understandings of the inventors:

At present, in the manufacturing process of Mini/Micro-LED (Mini/Micro light emitting diode) products, problems such as partial explosion and oxidation of FPC bonding wires exist. It is found through analysis that one possible reason for the explosion failure (DGS failure) is that the introduction of foreign matter 1 (foreign particles (P/T), etc.) in a backplane manufacturing process leads to a film formation defect, which is further aggravated by the external environment (such as metal migration and growth in metal traces), causing the damage of an insulating layer 3, which leads to the connection between two metal trace layers 2 to form a short circuit. Specifically, refer to FIG. 1, before the film formation of a lower metal trace, P/T is introduced, a film layer bulges during film formation, and the subsequent chain reaction of film formation is triggered; especially after metal P/T is introduced, the film layer bulges abnormally, and in the subsequent process, under the action of voltage, high temperature and high humidity, the P/T and the lower metal trace grow upwards, breaking an insulating protective layer 3 easily due to the absence of a metal shielding layer, as to be connected with an upper metal trace 5, resulting in the DGS failure. Please refer to FIG. 2 for the diagram of an abnormal film sample after foreign matter is introduced. Another possible reason is that a voltage difference exists between the upper and lower metal trace layers 2 and 5. Under the action of voltage, metal ions 4 in the metal traces migrate and grow, which destroys the insulating protective layer 3 between the metal trace layers 2 and 5, causing the two metal trace layers to be short-circuited (refer to FIG. 3 for the diagram of the principle and FIG. 4 for the diagram of a short-circuited sample). In addition, connecting wires used for connecting an FPC in a backplane are generally directly formed by the metal traces, while the metal traces exposed in the air may not withstand the high temperature and high humidity environment in subsequent processing, storage and transportation and tend to oxidize, thus affecting performance. In view of the above problems, after research, the inventors proposed that a barrier layer for preventing metal migration and growth should be disposed between the two metal trace layers, to greatly reduce the risk of short-circuit. Moreover, by disposing the barrier layer at a suitable position, the barrier layer may cover the metal traces used for connecting the FPC, to prevent direct contact between metal and the air, thereby reducing the risk of oxidation.

In view of this, in one aspect of the disclosure, a backplane is provided. According to the embodiment of the disclosure, referring to FIGS. 5 and 6, the backplane comprises a substrate 10; a first metal trace layer 20 disposed on one surface of the substrate 10; an insulating layer 30 disposed on a side, away from the substrate 10, of the first metal trace layer 20; a second metal trace layer 40 disposed on a side, away from the substrate 10, of the insulating layer 30, an overlapping area existing between an orthographic projection of the second metal trace layer 40 on the substrate 10 and an orthographic projection of the first metal trace layer 20 on the substrate 10; and a barrier layer 50 disposed between the first metal trace layer 20 and the second metal trace layer 40, an orthographic projection of the barrier layer 50 on the substrate 10 covering the overlapping area, and the barrier layer being used for preventing metals in the first metal trace layer 20 and the second metal trace layer 40 from migrating and growing towards each other. In the backplane, the barrier layer may effectively prevent the two metal trace layers from migrating and growing towards each other, thus effectively reducing the risk of short-circuit between the two metal trace layers, so that the risk of defects of devices adopting the backplane is reduced, the yield, safety and stability are improved, and the service life is prolonged.

According to the embodiment of the disclosure, a type of the substrate is not particularly limited, and may be flexibly selected according to practical needs, for example, a glass substrate, a polymer substrate, and the like. Further, in order to avoid the migration of substances in the substrate, which may affect a circuit structure on the substrate, referring to FIGS. 5 and 6, a buffer layer 60 may be provided on the substrate. The specific material and thickness of the buffer layer may be set according to the use requirements with reference to the conventional technology, and may not be described here. Therefore, the use effect of the backplane is better.

According to the embodiment of the disclosure, the insulating layer 30 may be a single-layer structure or a multilayer structure. In some specific examples, referring to FIGS. 5 and 6, the insulating layer 30 may comprise a first passivation layer 31 and a first flat layer 32 which are disposed in layer configuration, wherein the first passivation layer 31 is disposed close to the substrate. The first passivation layer may be made of inorganic materials, such as silicon nitride and silicon oxide, and the first flat layer may be made of organic materials, such as acrylic.

According to the embodiment of the disclosure, the first metal trace layer and the second metal trace layer in the backplane may each comprise various driving circuit signal wires and connecting wires. In other words, the first metal trace layer and the second metal trace layer are both patterned trace structures, and the traces may be electrically connected with or insulated from one another, which may be flexibly set according to practical use requirements. In some specific embodiments, referring to FIGS. 5 and 6, the backplane comprises a chip bonding area A and an FPC bonding area B, the first metal trace layer 20 may comprise a driving circuit signal wire 21 (specifically including a power wire (PWR), a ground wire (GND), etc.) located in the chip bonding area A and a first FPC connecting wire 22 located in the FPC bonding area B, while the second metal trace layer 40 may comprise a first electrode connecting wire 41 and a second electrode connecting wire 42 located in the chip bonding area A for connecting chips, and a second FPC connecting wire 43 located in the FPC bonding area B.

According to the embodiment of the disclosure, based on functional requirements, the signal wire or connecting wire in the first metal trace layer may be electrically connected with the signal wire or connecting wire in the second metal trace layer, and specifically may be connected through via holes. In some specific examples, referring to FIGS. 5 and 6, the first electrode connecting wire 21 may be electrically connected with the circuit driving signal wire 21 through a first via hole penetrating through the insulating layer 30. The second FPC connecting wire 43 may be electrically connected with the first FPC connecting wire through a via hole. Therefore, the structure may be simplified, wiring is easy, so that the implementation of backplane functions is facilitated.

According to the embodiment of the disclosure, materials of the first metal trace layer and the second metal trace layer are not particularly limited, and may be any metal which tends to migrate and grow. In some specific embodiments, the first metal trace layer and the second metal trace layer are each made of at least one of copper, aluminum and silver. Therefore, the metal with good conductivity may be fully utilized to meet the requirement for the electrical performance (such as low resistance) of the backplane, meanwhile, the risk of short-circuit caused by migration and growth is greatly reduced, and the yield of the backplane is improved.

According to the embodiment of the disclosure, the specific position of the barrier layer may be flexibly determined according to practical needs, as long as the barrier layer is located between the first metal trace layer and the second metal trace layer and is able to prevent the metals in the two metal trace layers from migrating and growing towards each other, which may otherwise cause a short circuit. Specifically, the barrier layer may be disposed on a surface, close to the second metal trace layer 40, of the first metal trace layer 20 (refer to FIG. 5), on a surface, close to the first metal trace layer 20, of the second metal trace layer 40 (refer to FIG. 6), or in the insulating layer 30 (not shown in the figures).

In some specific embodiments, when a voltage difference exists between the first metal trace layer and the second metal trace layer, the metals tend to migrate from a high voltage to a low voltage, resulting in a short circuit between the upper and lower metal layers. Therefore, if a voltage difference exists between the first metal trace layer and the second metal trace layer, when a voltage of the first metal trace layer is greater than a voltage of the second metal trace layer, the barrier layer is disposed on the surface, close to the second metal trace layer, of the first metal trace layer. When the voltage of the first metal trace layer is less than the voltage of the second metal trace layer, the barrier layer is disposed on the surface, close to the first metal trace layer, of the second metal trace layer. Therefore, the barrier layer has a better effect of preventing metal migration and growth.

Figure 7:
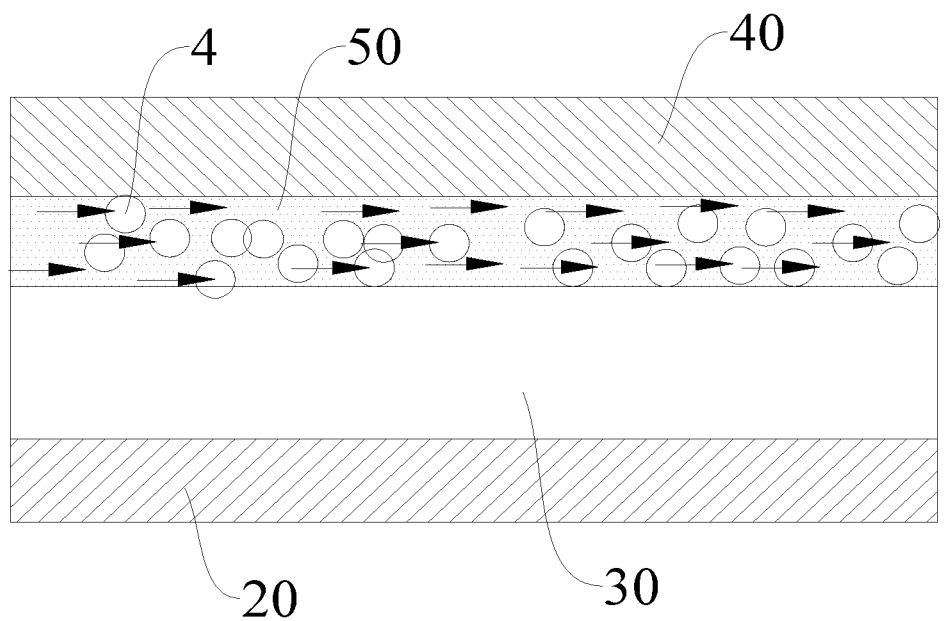
FIG. 7 is a diagram of the principle of a barrier layer preventing metal migration and growth in an embodiment of the disclosure.

Specifically, when a voltage difference exists between the first metal trace layer and the second metal trace layer, assuming that the voltage of the second metal trace layer is greater than the voltage of the first metal trace layer and the barrier layer is disposed on the surface, close to the first metal trace layer, of the second metal trace layer, referring to FIG. 7, the principle of the barrier layer preventing metal migration and growth is: by arranging the barrier layer, interlayer stress may prevent the second metal trace layer 40 from growing towards the first metal trace layer 20; and the barrier layer may be a conductive film layer, under a power-on state, metal ions migrating towards the first metal trace layer 20 may collide with conductive electrons in the barrier layer when passing by the barrier layer, hindering the movement of the metal ions towards the first metal trace layer 20, or even changing the movement direction, to reduce the short-circuit defect caused by metal ion migration.

Figure 8:
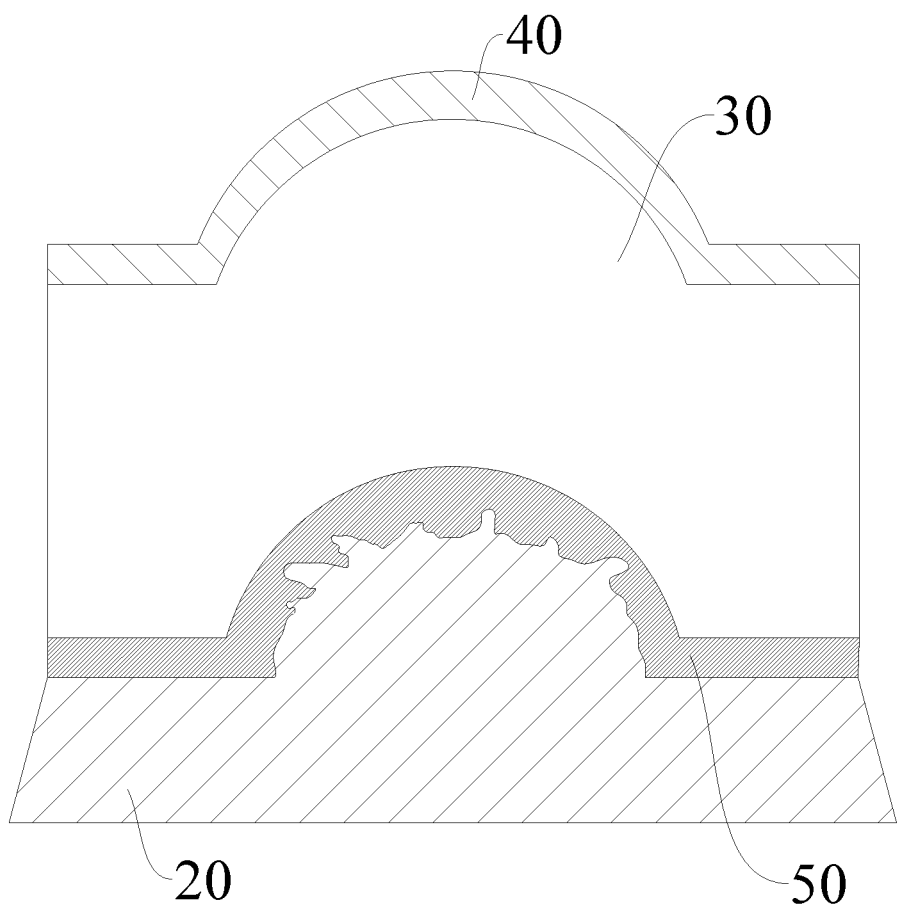
FIG. 8 is a diagram of the principle of a barrier layer preventing metal migration and growth in another embodiment of the disclosure.

When foreign particles are introduced in the manufacturing process, the specific principle is explained by assuming that the barrier layer is disposed on the surface, close to the second metal trace layer, of the first metal trace layer. Referring to FIG. 8, a barrier layer 50 is added to the surface, away from the substrate, of the first metal trace layer 20, so that the upward growth of P/T and metal in the first metal trace layer may be blocked, the insulating layer 30 may not be broke, and therefore the DGS failure caused by a short circuit is avoided.

The backplane of this application will be described in detail with reference to some specific embodiments.

Figure 9:
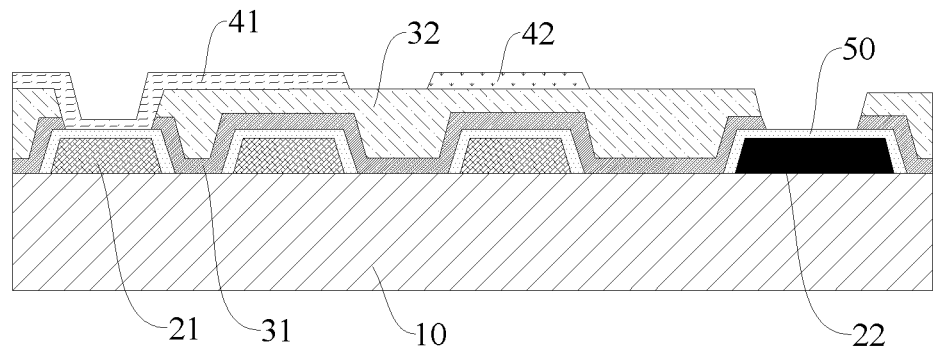
FIG. 9 is a partial cross-sectional structure diagram of a backplane according to another embodiment of the disclosure.

According to an embodiment of the disclosure, referring to FIG. 9, the barrier layer 50 is disposed on the surface, close to the second metal trace layer 40, of the first metal trace layer 20.

According to the embodiment of the disclosure, to prevent metal migration and growth to avoid a short circuit, it is only necessary to dispose a barrier layer in an overlapping area of the first metal trace layer and the second metal trace layer, that is, an orthographic projection of the barrier layer on the substrate completely overlaps with an overlapping area of the orthographic projections of the first metal trace layer and the second metal trace layer on the substrate. In order to simplify manufacture and reduce production costs, in some specific examples, referring to FIG. 9, the orthographic projection of the barrier layer 50 on the substrate 10 completely superposes with the orthographic projection of the first metal trace layer 20 on the substrate 10. Therefore, the barrier layer and the first metal trace layer may be formed by a mask, which is highly compatible with the existing manufacturing process, and may greatly reduce production costs and simplify manufacture.

Figure 5:
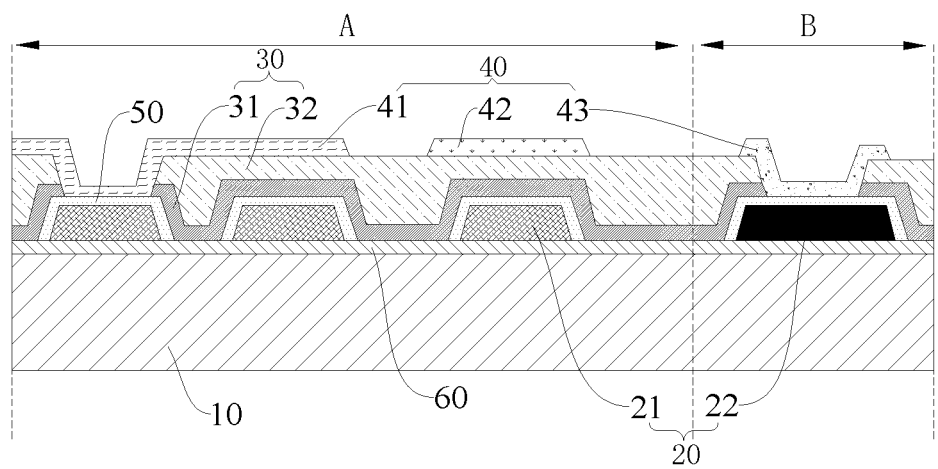
FIG. 5 is a partial cross-sectional structure diagram of a backplane according to an embodiment of the disclosure.
Figure 6:
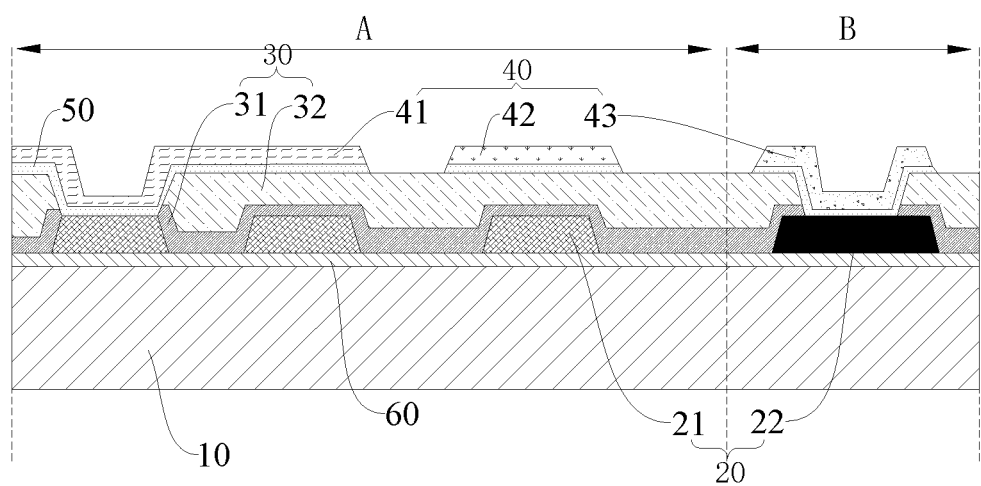
FIG. 6 is a partial cross-sectional structure diagram of a backplane according to another embodiment of the disclosure.

Generally, the first FPC connecting wire 22 in the first metal trace layer and the second FPC connecting wire 43 in the second metal trace layer are used together to connect an FPC (refer to FIGS. 5 and 6). In this embodiment of the disclosure, the surface, close to the second metal trace layer, of the first metal trace layer is provided with the barrier layer, which may cover the first metal trace layer, therefore, if a patterned shape of the second metal trace layer is further adjusted and the second metal trace layer is not provided at an FPC connection position, the first FPC connecting wire 22 may be covered by the barrier layer 50, and thus the metal is prevented from being directly exposed to the air to be oxidized. Therefore, in some specific examples, referring to FIG. 9, an orthographic projection of the first FPC connecting wire 22 in the first metal trace layer on the substrate does not overlap with an orthographic projection of the second metal trace layer 40 on the substrate at all. Therefore, since the barrier layer covers the first metal trace layer, the first FPC connecting wire 22 may not be directly exposed, which greatly reduces the risk of metal oxidation of the FPC connecting wire.

Figure 10:
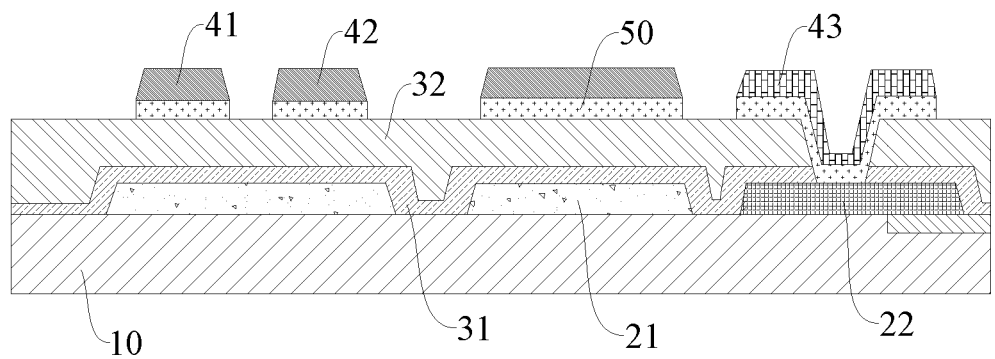
FIG. 10 is a partial cross-sectional structure diagram of a backplane according to another embodiment of the disclosure.

According to another embodiment of the disclosure, referring to FIG. 10, the barrier layer 50 is disposed on the surface, close to the first metal trace layer 20, of the second metal trace layer 40.

According to some embodiments of the disclosure, in order to simplify manufacture and reduce production costs, referring to FIG. 10, the orthographic projection of the barrier layer 50 on the substrate 10 completely superposes with the orthographic projection of the second metal trace layer 40 on the substrate 10. Therefore, the barrier layer and the second metal trace layer may be formed by a mask, which is highly compatible with the existing preparation process, and may greatly reduce production costs and simplify manufacture.

As mentioned above, according to the performing requirement of the backplane, the first metal trace layer may comprise a driving circuit signal wire and a first FPC connecting wire, while the second metal trace layer may comprise a first electrode connecting wire, a second electrode connecting wire and a second FPC connecting wire. In some specific examples, referring to FIG. 10, the second FPC connecting wire 43 is electrically connected with the first FPC connecting wire 22 through a via hole penetrating through the insulating layer 30. Therefore, the connection between the backplane and the FPC may be facilitated, allowing the FPC to transmit signals to the backplane easily.

Figure 11:
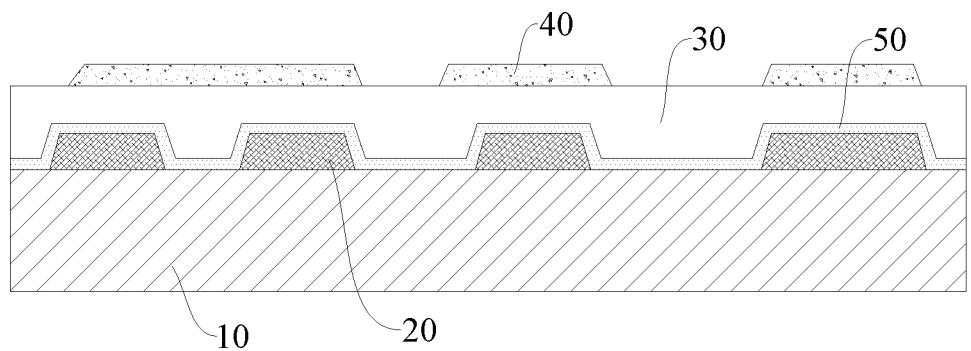
FIG. 11 is a partial cross-sectional structure diagram of a backplane according to another embodiment of the disclosure.

In another embodiment, referring to FIG. 11, the barrier layer 50 may be of a whole layer structure. Therefore, the complicated step of patterning may be omitted, and preparation is easier. It may be understood that when the barrier layer is disposed on the surface of the first metal trace layer or the second metal trace layer, if traces in the metal trace layers in contact with the barrier layer are all electrically connected, the barrier layer may be made of both conductive and non-conductive materials. If at least two traces in the metal trace layers in contact with the barrier layer need to be insulated from each other, the barrier layer of the whole layer structure needs to be made of a non-conductive material to avoid a short circuit between the traces that need insulation.

According to some specific embodiments of the disclosure, the barrier layer may be made of a conductive material, in this case, the barrier layer may not affect the electrical connecting relationship between the upper and lower metal trace layers, and at the same time, the movement direction of migrating metal ions may be well guided to avoid a short circuit between the two metal trace layers. Specifically, the conductive material may include conductive oxide, such as indium tin oxide (ITO). Therefore, the hardness and density of the barrier layer are better, and the effect of preventing metal migration and growth is better.

It may be understood that, in addition to the structures described above, the display backplane may also comprise structures and components necessary for a conventional backplane, which may not be described in detail here. According to some specific embodiments of the disclosure, the backplane may be used as a backplane for Mini-LED or Micro LED products, such as a backlight source, an illumination device or a displaying device. In this case, referring to FIGS. 12 and 13, the backplane may also comprise a second passivation layer 81 and a second flat layer 82, wherein the second passivation layer 81 is disposed on a surface, away from the substrate, of the second metal trace layer 40 and a surface, away from the substrate, of the insulating layer 30, the second flat layer 82 is disposed on a surface, away from the substrate, of the second passivation layer, and via holes are formed in the second passivation layer 81 and the second flat layer 82 to expose the first electrode connecting wire 41 and the second electrode connecting wire 42 in the second metal trace layer. Therefore, the second passivation layer 81 and the second flat layer 82 may protect the second metal trace layer, and at the same time, mutual influences with other structures disposed above are avoided.

Figure 14:
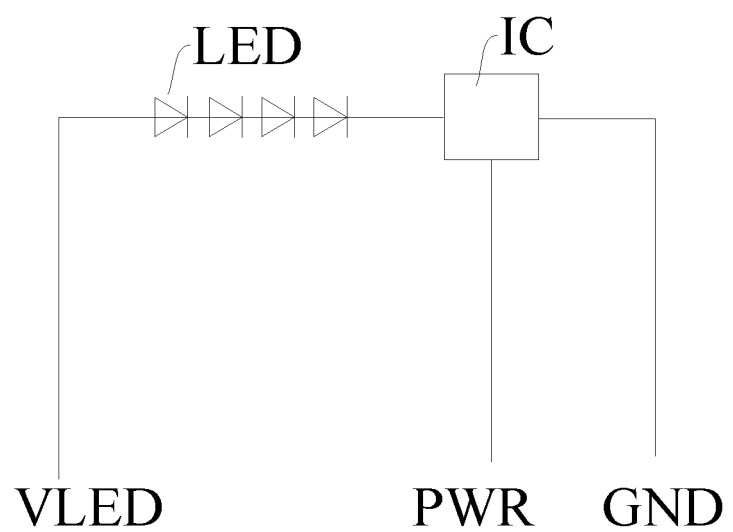
FIG. 14 is a Mini-LED backlight driving circuit diagram according to an embodiment of the disclosure.
Figure 15:
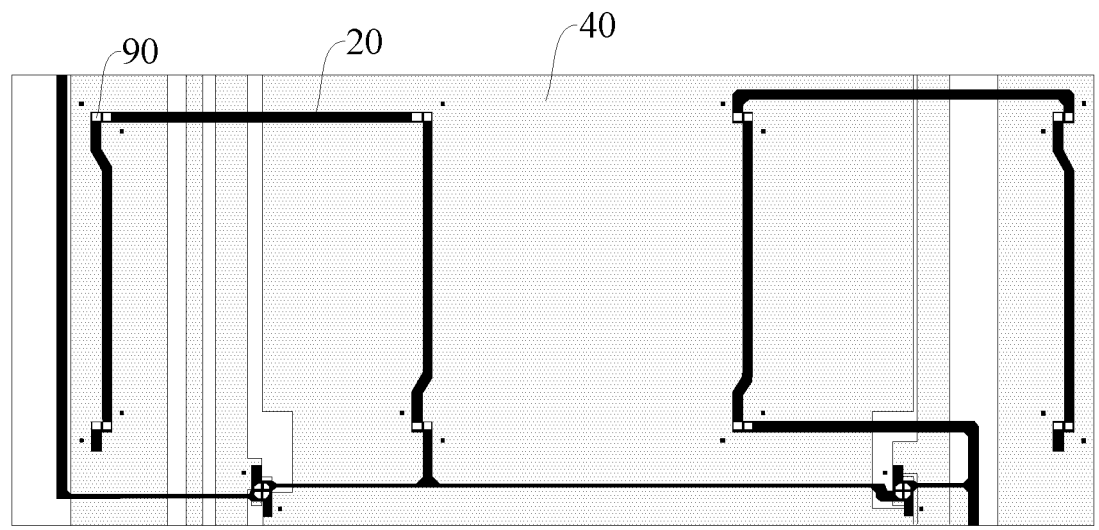
FIG. 15 is a Mini-LED backplane wiring design diagram according to an embodiment of the disclosure.

Specifically, when the backplane is applied to a Mini-LED backlight source, a Mini-LED backlight driving circuit diagram and a backplane wiring design diagram are shown in FIG. 14 and FIG. 15 respectively. According to the working principle of the Mini-LED backlight source, a VLED signal wire 100 provides a large constant current voltage for an LED chip 90 and then forms a loop with a GND signal wire 200, so a large voltage difference exists between the LED chip 90 and the GND signal wire 200. In the backplane design, due to wiring requirements, part of the GND signal wire 200 may be disposed under the LED chip, that is, a large voltage difference exists between the second metal trace layer 40 where an LED chip connecting wire is located and the first metal trace layer 20 where the GND signal wire is located, and the metal in the metal trace layer is prone to ion migration, which leads to a short circuit between the LED chip connecting wire and the GND signal wire, resulting in weak lighting of part of backlight, which affects the optical effect. By disposing the barrier layer of the disclosure, the ion migration of the metal may be effectively blocked, and the short-circuit risk is greatly reduced.

In yet another aspect of the disclosure, a method for manufacturing the aforementioned display backplane is provided. According to the embodiment of the disclosure, the method comprises: sequentially forming a first metal trace layer on a substrate; forming an insulating layer on a side, away from the substrate, of the first metal trace layer; forming a second metal trace layer on a side, away from the substrate, of the insulating layer, an overlapping area existing between an orthographic projection of the second metal trace layer on the substrate and an orthographic projection of the first metal trace layer on the substrate; and forming a barrier layer between the first metal trace layer and the second metal trace layer, an orthographic projection of the barrier layer on the substrate covering the overlapping area, and the barrier layer being used for preventing metals in the first metal trace layer and the second metal trace layer from migrating and growing towards each other. The method is easy and convenient to implement and highly compatible with existing processes, the risk of short-circuit of the obtained backplane is greatly reduced, and high yield, good stability and long service life are implemented.

According to some embodiments of the disclosure, the first metal trace layer, the second metal trace layer and the barrier layer may all be formed by a patterning process. Specifically, a whole film layer may be deposited in advance, and then the whole film layer is patterned. The specific patterning method may include photolithography, that is, exposing, developing and etching the whole film layer by using a mask to obtain the first metal trace layer, the second metal trace layer and the barrier layer. According to other embodiments of the disclosure, the patterned first metal trace layer, second metal trace layer and barrier layer may also be formed by one-step deposition directly using a mask.

According to the embodiment of the disclosure, in order to simplify the steps, the barrier layer may be formed with the first metal trace layer or the second metal trace layer through a mask, specifically, they may be formed by one-step deposition through a mask or by a patterning process. Therefore, the number of masks is reduced, the manufacturing cost is reduced, and operation is easier.

According to the embodiment of the disclosure, the insulating layer may be formed by a deposition method, and the specific deposition steps and parameters may be determined according to performance requirements with reference to the conventional technology, which may not be described in detail here.

Figure 13:
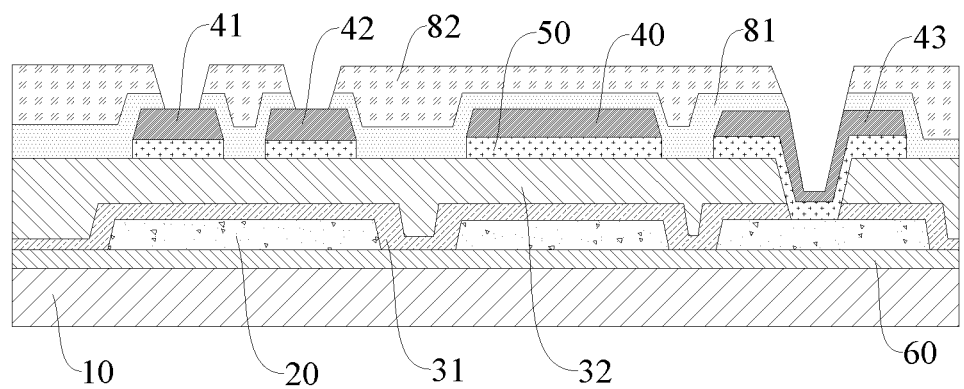
FIG. 13 is a partial cross-sectional structure diagram of a backplane according to another embodiment of the disclosure.

According to a specific example of the disclosure, the first metal trace layer (Cu1) and the second metal trace layer (Cu2) are both copper layers, and the backplane may be prepared by the following steps:
  (1) Manufacturing a Cu1 layer above the buffer layer by sputter, cleaning, coating, baking, photo, developing, hard baking, etch and stripping;
  (2) Manufacturing a PVX1 layer (first passivation layer) by sputter;
  (3) Manufacturing an OC1 layer (first flat layer) above the Cu1 layer by coating, photo and developing;
  (4) Etching off the PVX1 layer at an opening of OC1 by using the OC1 as a retaining wall through a dry etching process;
  (5) Manufacturing an ITO layer (barrier layer) above the OC1 layer by sputter, cleaning, coating, baking, photo, developing, hard baking, etch and stripping;
  (6) Manufacturing a Cu2 layer above the ITO layer by sputter, cleaning, coating, baking, photo, developing, hard baking, etch and stripping;
  (7) Manufacturing a PVX2 layer (second passivation layer) by sputter;
  (8) Manufacturing an OC2 layer (second flat layer) above the PVX2 layer by coating, photo and developing; and
  (9) Etching off the PVX2 layer at an opening of OC2 with the OC2 as a retaining wall through a dry etching process. Refer to FIG. 13 for the structural diagram of an obtained backplane.

Figure 12:
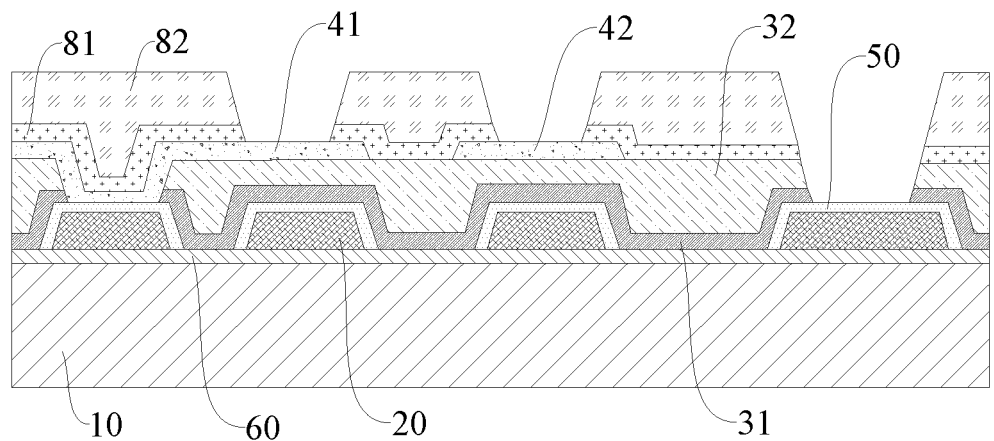
FIG. 12 is a partial cross-sectional structure diagram of a backplane according to another embodiment of the disclosure.

According to another specific example of the disclosure, the first metal trace layer (Cu1) and the second metal trace layer (Cu2) are both copper layers, and the backplane may be prepared by the following steps:
  1. Forming a Cu1 wide trace layer, which is performed by adopting two masks to increase copper thickness and meet electrical requirements;
  2. Performing ITO deposition (Dep) and photo & etch to form an ITO pattern (barrier layer), which is consistent with a Cu1 Pattern;
  3. Depositing PVX1 and OC1 (first flat layer) and performing opening, an opening being a joint between Cu1 and Cu2 and an FPC bonding opening, and removing PVX1 at the opening by dry etching, so that Cu1 and Cu2 are overlapped to form a closed circuit;
  4. Forming a Cu2 trace through deposition, which is an LED chip connecting wire, with Cu2 partially overlapped with Cu1 and no FPC bonding connecting wire; and
  5. Forming PVX2 and OC2 (second flat layer) through deposition and performing opening, and removing PVX2 by dry etching, to solder an LED chip. Refer to FIG. 12 for the structural diagram of an obtained backplane.

In another aspect of the disclosure, a backlight source, an illumination device or a displaying device is provided. According to the embodiment of the disclosure, the backlight source, the illumination device or the displaying device comprises the aforementioned backplane. The risk of short-circuit of metal traces in the backlight source, the illumination device or the displaying device is greatly reduced, safety and stability are significantly improved, and the service life is effectively prolonged.

Figure 16:
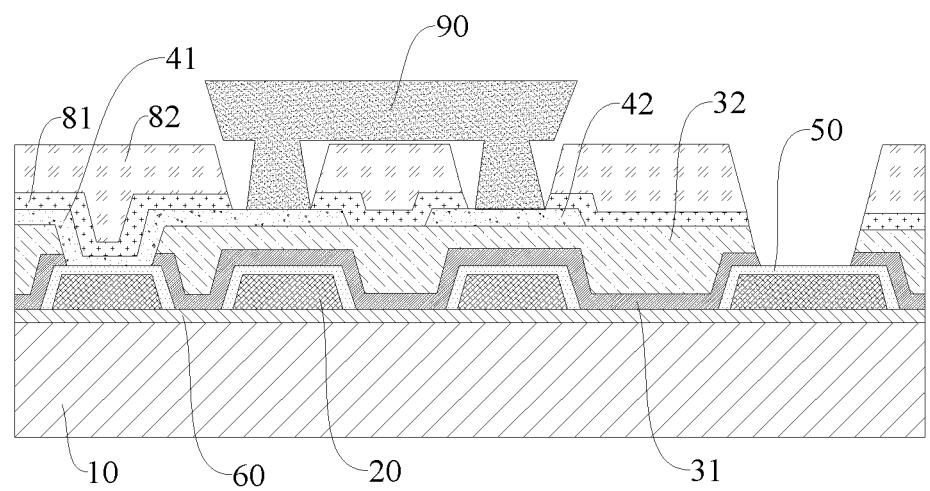
FIG. 16 is a partial cross-sectional structure diagram of a backlight source, an illumination device or a displaying device according to an embodiment of the disclosure.
Figure 17:
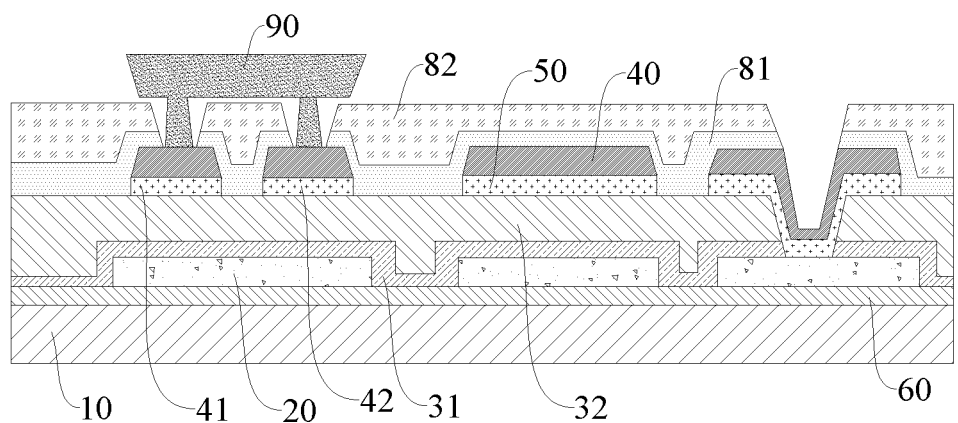
FIG. 17 is a partial cross-sectional structure diagram of a backlight source, an illumination device or a displaying device according to another embodiment of the disclosure.

According to the embodiment of the disclosure, referring to FIGS. 16 and 17, the backlight source, the illumination device or the displaying device further comprises an LED chip 90 electrically connected with the first electrode connecting wire 41 and the second electrode connecting wire 42 in the second metal trace layer 40 of the backplane. According to a specific embodiment of the disclosure, the LED chip may be a Mini LED chip or a Micro LED chip. For Mini-LED or Micro LED products, in order to meet the requirement for low channel resistance, a thick Cu process is usually adopted for traces, but Cu is an active metal, so copper migration and growth tend to occur in upper and lower trace layers, which leads to a short circuit between the upper and lower metal layers. By adopting the backplane with the barrier layer, the occurrence of a short circuit caused by copper migration and growth may be effectively reduced, and the yield of products may be improved.

It may be understood that, in addition to the structures described above, the backlight source, illumination device or displaying device may also comprise necessary structures and components of a conventional backlight source, illumination device or displaying device, which may be specifically set with reference to the conventional technology and may not be described in detail here.

In the description of the disclosure, it should be understood that the terms "first" and "second" are only used for descriptive purposes, and cannot be understood as indicating or implying relative importance or implicitly indicating the number of indicated technical features. Therefore, the features defined with "first" and "second" may explicitly or implicitly include one or more of the features. In the description of the disclosure, "a plurality of" means two or more, unless otherwise specifically defined.

In the disclosure, unless otherwise specified and limited, a first feature is "above" or "below" a second feature may mean that the first feature and the second feature are in direct contact, or the first feature and the second feature are in indirect contact through an intermediary. Furthermore, the first feature is "above" the second feature may be that the first feature is directly above or obliquely above the second feature, or it only means that a level of the first feature is higher than that of the second feature; and the first feature is "below" the second feature may be that the first feature is directly below or obliquely below the second feature, or it only means that the level of the first feature is lower than that of the second feature.

In the description of this specification, descriptions referring to the terms "one embodiment", "some embodiments", "example", "specific example", or "some examples" mean that specific features, structures, materials or characteristics described in connection with the embodiment or example are included in at least one embodiment or example of the disclosure. In this specification, the schematic expressions of the above terms do not necessarily refer to the same embodiments or examples. Furthermore, the specific features, structures, materials or characteristics described may be combined in any one or more embodiments or examples in a suitable manner. In addition, those skilled in the art may combine different embodiments or examples and features of different embodiments or examples described in this specification without contradicting each other.

Although the embodiments of the disclosure have been shown and described above, it can be understood that the above-mentioned embodiments are exemplary and cannot be understood as limiting the disclosure, and those of ordinary skill in the art can make changes, modifications, substitutions and variations to the above-mentioned embodiments within the scope of the disclosure.

The invention claimed is:

1. A backplane, comprising:
   a substrate;
   a first metal trace layer disposed on a surface of the substrate;
   an insulating layer disposed on a side, away from the substrate, of the first metal trace layer;
   a second metal trace layer disposed on a side, away from the substrate, of the insulating layer, and an overlapping area existing between an orthographic projection of the second metal trace layer on the substrate and an orthographic projection of the first metal trace layer on the substrate; and
   a barrier layer disposed between the first metal trace layer and the second metal trace layer and configured for preventing metals in the first metal trace layer and the second metal trace layer from migrating and growing towards each other;
   wherein the barrier layer is disposed on a surface, close to the second metal trace layer, of the first metal trace layer.

2. The backplane according to claim 1, wherein a voltage difference exists between the first metal trace layer and the second metal trace layer;
   when a voltage of the first metal trace layer is greater than a voltage of the second metal trace layer, the barrier layer is disposed on a surface, close to the second metal trace layer, of the first metal trace layer; or
   when the voltage of the first metal trace layer is less than the voltage of the second metal trace layer, the barrier layer is disposed on a surface, close to the first metal trace layer, of the second metal trace layer.

3. The backplane according to claim 1, wherein an orthographic projection of the barrier layer on the substrate completely superposes with the orthographic projection of the first metal trace layer on the substrate.

4. The backplane according to claim 1, wherein the first metal trace layer comprises a first FPC connecting wire, an orthographic projection of the first FPC connecting wire on the substrate and the orthographic projection of the second metal trace layer on the substrate are completely non-superposed.

5. The backplane according to claim 4, wherein the first metal trace layer comprises a circuit driving signal wire, the second metal trace layer comprises a first electrode connecting wire and a second electrode connecting wire, and the first electrode connecting wire is electrically connected with the circuit driving signal wire through a first via hole penetrating through the insulating layer.

6. The backplane according to claim 1, wherein the first metal trace layer and the second metal trace layer are each made of at least one of copper, aluminum and silver.

7. The backplane according to claim 1, wherein the barrier layer is made of a conductive material, the conductive material comprises a conductive oxide, and the conductive oxide comprises indium tin oxide.

8. The backplane according to claim 1, wherein the barrier layer is of a whole layer structure and is made of a non-conductive material.

9. A backlight source, an illumination device or a displaying device, comprising the backplane according to claim 1.

10. An illumination device comprising the backplane according to claim 1.

11. A displaying device comprising the backplane according to claim 1.

12. The backlight source according to claim 9, further comprising:
an LED chip electrically connected with a first electrode connecting wire and a second electrode connecting wire in the second metal trace layer of the backplane.

13. The backlight source according to claim 12, wherein the LED chip is a Mini LED chip or a Micro LED chip.

14. The illumination device according to claim 10, further comprising:
an LED chip electrically connected with a first electrode connecting wire and a second electrode connecting wire in the second metal trace layer of the backplane.

15. A backplane, comprising:
a substrate;
a first metal trace layer disposed on a surface of the substrate;
an insulating layer disposed on a side, away from the substrate, of the first metal trace layer;
a second metal trace layer disposed on a side, away from the substrate, of the insulating layer, and an overlapping area existing between an orthographic projection of the second metal trace layer on the substrate and an orthographic projection of the first metal trace layer on the substrate; and
a barrier layer disposed between the first metal trace layer and the second metal trace layer and configured for preventing metals in the first metal trace layer and the second metal trace layer from migrating and growing towards each other;
wherein the barrier layer is disposed on a surface, close to the first metal trace layer, of the second metal trace layer;
wherein an orthographic projection of the barrier layer on the substrate completely superposes with the orthographic projection of the second metal trace layer on the substrate.

16. The backplane according to claim 15, wherein the first metal trace layer comprises a first FPC connecting wire, the second metal trace layer comprises a second FPC connecting wire, and the second FPC connecting wire is electrically connected with the first FPC connecting wire through a second via hole penetrating through the insulating layer.

17. A method for manufacturing a backplane, comprising:
forming a first metal trace layer on a substrate;
forming an insulating layer on a side, away from the substrate, of the first metal trace layer;
forming a second metal trace layer on a side, away from the substrate, of the insulating layer, wherein an overlapping area exists between an orthographic projection of the second metal trace layer on the substrate and an orthographic projection of the first metal trace layer on the substrate; and
forming a barrier layer between the first metal trace layer and the second metal trace layer, wherein an orthographic projection of the barrier layer on the substrate covers the overlapping area, and the barrier layer is configured for preventing metals in the first metal trace layer and the second metal trace layer from migrating and growing towards each other;
wherein the barrier layer is disposed on a surface, close to the second metal trace layer, of the first metal trace layer.

18. The method according to claim 17, wherein the barrier layer and the first metal trace layer or the second metal trace layer are formed by a mask.

* * * * *

UNITED STATES PATENT AND TRADEMARK OFFICE
CERTIFICATE OF CORRECTION

PATENT NO. : 12,232,252 B2
APPLICATION NO. : 17/508932
DATED : February 18, 2025
INVENTOR(S) : Yongfei Li et al.

Page 1 of 1

It is certified that error appears in the above-identified patent and that said Letters Patent is hereby corrected as shown below:

On the Title Page

Item (73) should read:
Assignees: Hefei Xinsheng Optoelectronics Technology Co., Ltd., Hefei, Anhui (CN); BOE Technology Group Co., Ltd., Beijing (CN)

Signed and Sealed this
Twenty-fifth Day of March, 2025

Coke Morgan Stewart
*Acting Director of the United States Patent and Trademark Office*